(12) United States Patent
Rossum

(10) Patent No.: US 11,202,147 B2
(45) Date of Patent: Dec. 14, 2021

(54) AUDIO FILTER WITH THROUGH-ZERO LINEARLY VARIABLE RESONANT FREQUENCY

(71) Applicant: Rossum Electro-Music, LLC, Santa Cruz, CA (US)

(72) Inventor: David Rossum, Santa Cruz, CA (US)

(73) Assignee: Rossum Electro-Music, LLC, Santa Cruz, CA (US)

( * ) Notice: Subject to any disclaimer, the term of this patent is extended or adjusted under 35 U.S.C. 154(b) by 0 days.

(21) Appl. No.: 16/723,923

(22) Filed: Dec. 20, 2019

(65) Prior Publication Data
US 2020/0213733 A1    Jul. 2, 2020

Related U.S. Application Data

(60) Provisional application No. 62/784,971, filed on Dec. 26, 2018.

(51) Int. Cl.
*H04R 3/04*    (2006.01)
*H03H 17/02*   (2006.01)

(52) U.S. Cl.
CPC .............. *H04R 3/04* (2013.01); *H03H 17/02* (2013.01)

(58) Field of Classification Search
CPC . H04R 3/04; H04R 3/14; H03G 5/165; H03G 5/025
USPC .............. 381/118, 98–99; 84/723, 726–727, 84/699–700
See application file for complete search history.

(56) References Cited

U.S. PATENT DOCUMENTS

| | | | |
|---|---|---|---|
| 4,180,707 A | 12/1979 | Moog | |
| 5,157,623 A | 10/1992 | Hayashi | |
| 5,170,369 A | 12/1992 | Rossum | |
| 5,574,792 A * | 11/1996 | Konno | ...................... H03G 3/04 |
| | | | 381/101 |
| 6,504,935 B1 | 1/2003 | Jackson | |
| 6,664,460 B1 | 12/2003 | Pennock et al. | |
| 9,514,727 B2 * | 12/2016 | Liptac | ....................... G10H 1/12 |

(Continued)

OTHER PUBLICATIONS

Massie, Dana, "Coefficient Interpolation for the Max Mathews Phasor Filter," (AES Convention Papers, 113rd Convention, 2012), 8 pages.

(Continued)

*Primary Examiner* — Disler Paul
(74) *Attorney, Agent, or Firm* — Carr & Ferrell LLP

(57) ABSTRACT

An audio filter and corresponding method with through-zero linearly variable resonant frequency are described. An example method includes receiving an input signal; receiving one or more control input signals; and providing a resonant filter for electronic music for processing the input signal. The resonant filter can include an exponential times linear multiplication to produce the resonant frequency control responsive to control voltages exponentially for musical octave/semitone control, and linearly for timbre modulation, the waveform being invariant over corresponding exponential changes in pitch of both input signal and filter resonance. The linear modulation can include inverting the sign of a bandpass feedback based on the sign of the resonant frequency variable so as to maintain stability. In the example method, to prevent a glitch on the output when frequency changes sign, a separate highpass output signal may be generated.

21 Claims, 6 Drawing Sheets

(56) References Cited

U.S. PATENT DOCUMENTS

| | | | |
|---|---|---|---|
| 9,552,826 B2* | 1/2017 | Kimura | H03G 9/025 |
| 10,514,883 B2 | 12/2019 | Rossum | |
| 2005/0190930 A1* | 9/2005 | Desiderio | H03G 5/04 |
| | | | 381/103 |
| 2009/0164905 A1 | 6/2009 | Ko | |
| 2015/0317966 A1* | 11/2015 | Liptac | G10H 3/186 |
| | | | 84/735 |
| 2018/0239578 A1 | 8/2018 | Rossum | |
| 2021/0233504 A1 | 7/2021 | Bliss | |

OTHER PUBLICATIONS

Rossum, Dave, "The 'ARMAdillo' Coefficient Encoding Scheme for Digital Audio Filters", IEEE ASSP Workshop on Applications of Signal Processing to Audio and Acoustics, Oct. 1991, 2 pages.

Rossum, Dave, "Making digital filters sound 'analog'", International Computer Music Association, vol. 1992, 1992, pp. 30-33.

Chowning, John, "The Synthesis of Complex Audio Spectra by Means of Frequency Modulation," Journal of the Audio Engineering Society, vol. 21, Issue 7; Sep. 1973.; pp. 526-534; available at: <https://web.eecs.umich.edu/~fessler/course/100/misc/chowning-73-tso.pdf>.

Mathews et al., "Methods for Synthesizing Very High Q Parametrically Well Behaved Two Pole Filters," Stockholm Musical Acoustic Conference (SMAC), Aug. 6-9, 2003, available at <https://ccrma.stanford.edu/~jos/smac03maxjos/smac03maxjos.pdf>. 10 pages.

Parker et al., "Dynamic FM synthesis Using a Network of Complex Resonator Filters," Proceedings of the Sound and Music Computing Conference 2013, 2013, Stockholm, Sweden, available at <https://tai-studio.org/img/portfolio/complexres/Parker_2013.pdf>, pp. 668-673.

Wikipedia: "State Variable Filter" [online], [retreived on Dec. 18, 2018], Retreived from the Internet: <https://en.wikipedia.org/wiki/State_variable_filter>, 2 pages.

Smith, Julius, "Digital State-Variable Filters," Center for Computer Research in Music and Acoustics (CCRMA), Department of Music, Stanford University, Stanford, California 94305 USA, Feb. 25, 2018, available at: <https://ccrma.stanford.edu/~jos/svf/svf.pdf>, 9 pages.

Wise, Duane, "The Modified Chamberlin and Zölzer Filter Structures," in Proceedings of the 9th International Conference on Digital Audio Effects, Montreal, Canada, Sep. 18-20, 2006; available at <https://pdfs.semanticscholar.org/413f/eafa02adfd32b273305206aa18f42d7dad5f.pdf>, DAFX-53-DAFX-56; (4 pages).

Curtis Electro-Music Specialties, "CEM3340/3345 Voltage Controlled Oscillator" Datasheet; [online], [retreived on Jan. 27, 2020], Retreived from the Internet: <https://nebula.wsimg.com/1c34939ca17fdcf07c8ceee4661ba253? AccessKeyId=E68C2B1C2930EF53D3A4>, 6 pages.

Janne808, "Zero State Machine—Mathematics, hacking and the daily struggle," Radio Free Robotron [online], Sep. 4, 2015 [retreived on Jan. 27, 2020], Retreived from the Internet: <URL:http://www.radiofreerobotron.net/blog/2015/09/04/how-to-zero-delay-state-variable-filter/>, 4 pages.

Simper, Andrew "Solving the Continuous SVF Equations Using Trapezoidal Integration and Equivalent Currents," Cytomic, [online], [retrieved on Jan. 27, 2020], Retrieved from the Internet: <URL:https://cytomic.com/files/dsp/SvfLinearTrapOptimised2.pdf>, 32 pages.

Cytomic.com, "Technical Papers" [online], [retreived on Jan. 27, 2020], Retreived from the Internet: <https://cytomic.com/index.php?q=technical-papers>, 5 pages.

* cited by examiner

AUDIO FILTER WITH THROUGH-ZERO LINEARLY VARIABLE RESONANT FREQUENCY

CROSS REFERENCES TO RELATED APPLICATION

This non-provisional patent application claims the benefit of U.S. provisional patent application No. 62/784,971, filed on Dec. 26, 2018, which is hereby incorporated by reference in its entirety.

TECHNICAL FIELD

The present technology relates generally to audio processing, and more particularly, but not by limitation, to creating very pleasing sounding timbral modulation of an input signal.

BACKGROUND

The approaches described in this section could be pursued but are not necessarily approaches that have previously been conceived or pursued. Therefore, unless otherwise indicated, it should not be assumed that any approaches described in this section qualify as prior art merely by virtue of their inclusion in this section.

Resonant filters for electronic music are typically controlled in their resonant frequency by an "exponential" (1 volt per octave) frequency input. This works well because humans perceive pitch or frequency exponentially, i.e., in octaves and semitones. This is similar to the control of the frequency of electronic music voltage controlled oscillators.

Electronic music oscillators can also have linear frequency control inputs. Modulating the frequency of an oscillator linearly has the desirable characteristic that for audio rate modulations the perceived pitch of the output signal is not altered as the amount (depth, or index) of modulation varies. To the inventor's knowledge, linear frequency inputs have not been made available on any electronic music filter products.

In the 1970s, John Chowning discovered that extending the range of linear frequency modulation (FM) through zero frequency produced a wide variety of interesting timbres in the resulting oscillator output signals. Chowning Frequency Modulation (FM) is described at the following link: https://web.eecs.umich.edu/~fessler/course/100/misc/chowning-73-tso.pdf. Both analog and digital implementations of "through-zero" frequency modulation oscillators have been produced.

However, the use of through-zero filter resonant frequency modulation has only been explored to a very limited extent, specifically only the linear frequency modulation of phasor resonators. Negative Frequency Phasor Resonator aspects are described at the following link: https://tai-studio.org/img/portfolio/complexres/Parker_2013.pdf.

More specifically, negative frequency for a state variable filter had been specifically stated to not be practical due to instability, see for example, "The Modified Chamberlin and Zolzer Filter Structures" by Duane. K. Wise in Proc. of the 9th Int. Conference on Digital Audio Effects, Montreal, Canada, Sep. 18-20, 2006 at https://pdfs.semanticscholar.org/413f/eafa02adfd32b273305206aal8f42d7dad5f.pdf.

SUMMARY

This section is provided to introduce a selection of concepts in a simplified form that are further described below in the Detailed Description section. This summary is not intended to identify key features or essential features of the claimed subject matter, nor is it intended to be used as an aid in determining the scope of the claimed subject matter.

According to an example embodiment, a method includes providing an audio filter with through-zero linearly variable resonant frequency. An example method includes receiving an input signal; receiving one or more control input signals; and providing a resonant filter for electronic music for processing the input signal. In the example method the resonant filter is responsive to the one or more control input signals to produce a resonant frequency that is exponentially controlled for musical octave/semitone control and linearly controlled for timbre modulation, such that the resonant filter provides an output signal that has very pleasing timbral modulation of the input signal and filter resonance.

In various embodiments, the signal passing electronic music resonant filter comprises a state variable filter (which may be stereo) configured to provide for linearly modulating its resonant frequency through zero while maintaining stability.

In some embodiments, the signal passing electronic music resonant filter includes an exponential times linear multiplication to produce the proper resonant frequency in response to control voltages that is exponential for musical octave/semitone control, and linear for timbre modulation, wherein the waveform is invariant over corresponding exponential changes in pitch of both input signal and filter resonance. More specifically, in some embodiments the waveform is invariant when the both the filter resonant frequency's exponential pitch control is changed and the input signal's pitch is changed in the same ratio. So, for example, if a 1V=1 Octave pitch change is made to the filter's exponential input, and the input signal is similarly changed in pitch by one octave, the filter output waveform will remain the same According to another embodiment, a method for providing an audio filter with through-zero linearly variable resonant frequency is provided. The example method comprising receiving an input signal; receiving one or more control input signals; and providing a resonant filter for electronic music for processing the input signal, the resonant filter being responsive to the control input signals to produce a resonant frequency in response to control voltages that is exponential for musical octave/semitone control and linear for timbre modulation, such that the resonant filter provides an output signal that has very pleasing timbral modulation of the input signal and resonance.

According to an example embodiments, a digital filter module is provided, comprising one or more control inputs; a processor, and a memory for storing executable instructions, the processor executing instructions to: receive, via the digital filter module, at least one input audio signal; receive via the one or more control inputs at least one control voltage; linearly modulating frequency of the at least one input audio signal through zero frequency to enable negative frequency modulation so as to produce a very acoustically pleasing timbral modulation of the input signal and any filter resonances; performing exponential times linear multiplication to determine the resonant frequency, responsive to the at least one control voltages, that is exponential for musical octave/semitone control and linear for timbre modulation, wherein the digital filter waveform is invariant over corresponding exponential changes in pitch of both the at least one input audio signal and the digital filter module resonant frequency.

According to other embodiments, a resonant audio filter having through-zero linearly variable resonant frequency is provided. An example resonant audio filter comprises a stereo state variable filter configured to provide lowpass, bandpass, and highpass outputs; the stereo state variable filter linearly modulating the resonant frequency of a stereo state variable filter through zero into negative frequency while maintaining stability; and circuitry for providing exponential times linear multiplication to produce the resonant frequency in response to input control voltages for an input signal, the resonant frequency response to control voltages being exponential for musical octave/semitone control and linear for timbre modulation.

Additional objects, advantages, and novel features of the examples will be set forth in part in the description which follows, and in part will become apparent to those skilled in the art upon examination of the following description and the accompanying drawings or may be learned by production or operation of the examples. The objects and advantages of the concepts may be realized and attained by means of the methodologies, instrumentalities and combinations particularly pointed out in the appended claims.

BRIEF DESCRIPTION OF THE DRAWINGS

Certain embodiments of the present technology are illustrated by the accompanying figures. It will be understood that the figures are not necessarily to scale and that details not necessary for an understanding of the technology or that render other details difficult to perceive may be omitted. It will be understood that the technology is not necessarily limited to particular embodiments illustrated herein.

DETAILED DESCRIPTION

Figure 1:
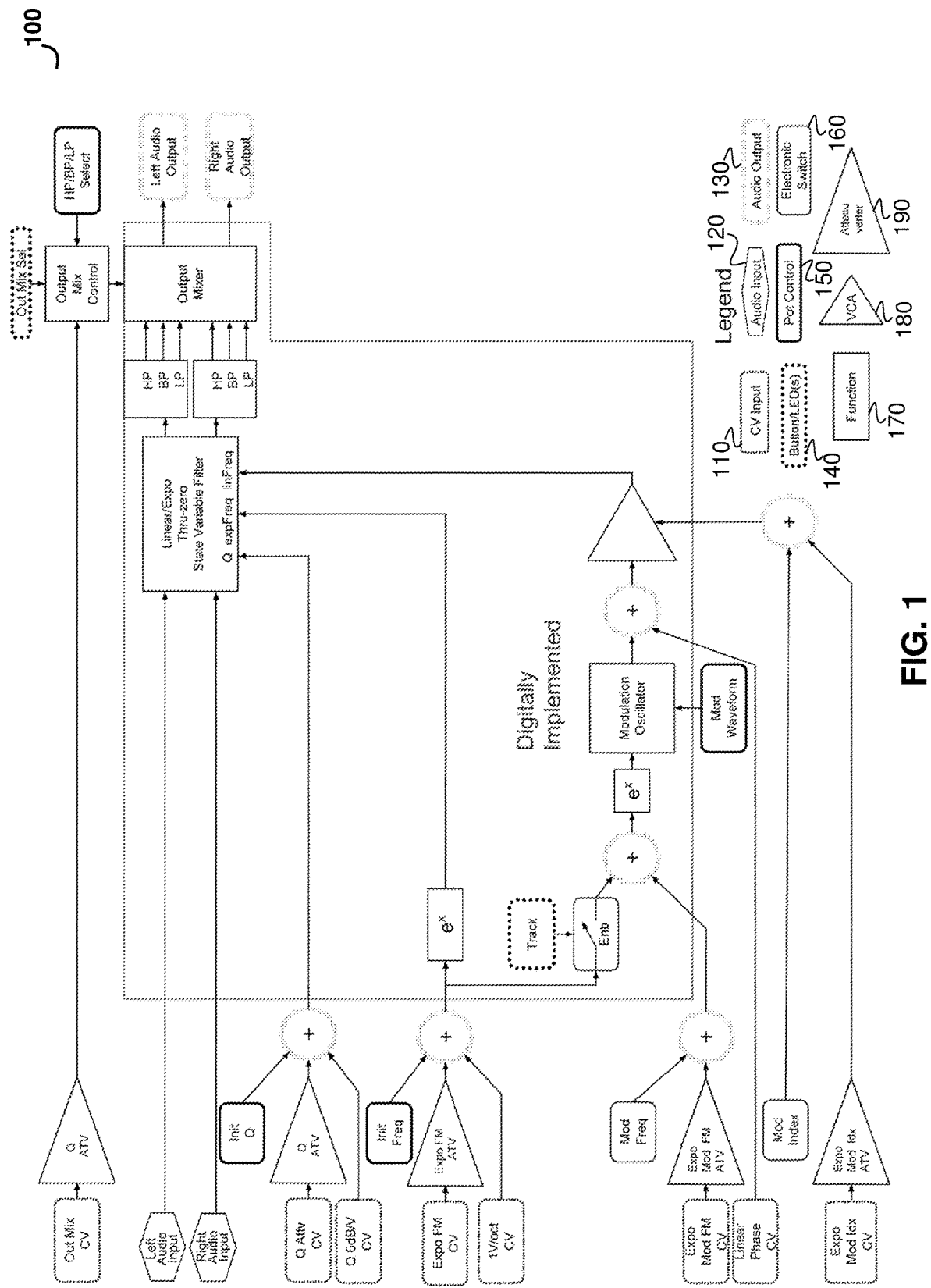
FIG. 1 illustrates an example embodiment showing explicitly the exponential times linear multiplication technique to produce the proper resonant frequency in response to control voltages that is exponential for musical octave/semitone control, and linear for timbre modulation, wherein the waveform is invariant over corresponding exponential changes in pitch of both input signal and filter resonance.

The following detailed description includes references to the accompanying drawings, which form a part of the detailed description. The drawings show illustrations in accordance with example embodiments. These example embodiments, which are also referred to herein as "examples," are described in enough detail to enable those skilled in the art to practice the present subject matter. The embodiments can be combined, other embodiments can be utilized, or structural, logical and electrical changes can be made without departing from the scope of what is claimed. The following detailed description is, therefore, not to be taken in a limiting sense, and the scope is defined by the appended claims and their equivalents.

In various embodiments, the methods and systems of the present technology provide an audio filter with through-zero linearly variable resonant frequency. In various embodiments, the present technology may be viewed in simple terms as creating a signal passing electronic music resonant filter having the ability to be stably modulated in frequency in a linear manner through zero frequency. The audible result from various embodiments is very pleasing timbral modulation of the input signal and any filter resonances.

It would seem practical to linearly modulate a phasor filter (as noted in a description of phasor filters at the following link: https://ccrma.stanford.edu/~jos/smac03maxjos/smac03maxjos.pdf. However, the inventor was unable to be successful in obtaining a broadly musically useful implementation focused on linearly modulating a phasor filter. Instead, the inventor changed to pursuing a state variable approach for various embodiments. State Variable Filters are described at the following link: https://en.wikipedia.org/wiki/State_variable_filter. The inventor has shown through simulation that it is possible to build such a filter using analog techniques. The inventor has also digitally implemented variations on the Chamberlain State Variable filter that allow negative frequency modulation. Chamberlain and other State Variable (SV) filters are described at the following link: https://ccrma.stanford.edu/~jos/svf/svf.pdf. The Chamberlain approach can be optimally tailored in various embodiments of the present technology. An example embodiment comprises a unique combination that may be configured or modified for use for this tailoring. For example, a combination that may be used includes the use of the well-known techniques of a sufficiently high sample rate for the desired audio bandwidth and maximum modulation index (oversampling), along with the use of trapezoidal integration. Trapezoidal integration for a state variable filter is described in http://www.radiofreerobotron.net/blog/2015/09/04/how-to-zero-delay-state-variable-filter/and https://cytomic.com/files/dsp/SvfLinearTrapOptimised2.pdf.

One of the key elements of various embodiments of the present technology is to invert the sign of the bandpass feedback based on the sign of the frequency variable. This can be done in either a digital or analog implementation. Such a modification may add a non-linear element to the loop. As a result, under certain conditions, undesirable discontinuities can appear in the highpass output of the filter. Another modification to the equations can minimize or eliminate this issue.

In various embodiments, there are a number of details in the implementation, as well as some system aspects that allow optimal use of the present technology. FIG. 1 is a block diagram 100 illustrating various details of an example embodiment. In some embodiments, some degree of soft clipping or other transfer function is included to minimize overload in a musically acceptable or useful manner.

More specifically regarding FIG. 1, this diagram illustrates an example embodiment showing explicitly the exponential times linear multiplication technique to produce the proper resonant frequency in response to control voltages that is exponential for musical octave/semitone control, and linear for timbre modulation, wherein the waveform is invariant over corresponding exponential changes in pitch of both input signal and filter resonance.

Specifically, the filter resonant frequency F, which has a nominal value $F_0$ when its control inputs are all zero, can be expressed as:

$$F=F_0*(1+K*\text{linearCV})*2^{(expoCV)}$$

Where linearCV is the linear control voltage in volts, expoCV is the 1V/octave exponential control voltage in volts, and K is a constant that determines the maximum attainable modulation index.

FIG. 1 also illustrates an example embodiment showing a VCA controlling the magnitude of the linear frequency modulation; this magnitude is called the modulation index. In typical embodiments, the modulation index varies from zero to a maximum linear gain of 4; this corresponds to linear frequency modulations from five times the resonant frequency of the unmodulated filter to negative three times the unmodulated resonant frequency.

FIG. 1 also illustrates an example embodiment showing a modulation oscillator providing the linear frequency modulation signal. The modulation oscillator's frequency control may be configured to accurately track the exponentially controlled resonant frequency of the filter. When tracking is enabled, and the ratio of the modulation oscillator's frequency to the filter's exponentially controlled resonant frequency is a ratio of small whole numbers, the resulting timbre is particularly pleasing. By digitally implementing both the filter and the modulation oscillator, the accuracy of the tracking can be made to be exact.

In FIG. 1, various acronyms are used for some of the blocks including HP, BP and LP for high pass, band pass, and low pass, respectively, CV for control voltage, along with others that would be apparent to one of ordinary skill in the art. While FIG. 1 shows certain portions of the embodiment to be digitally implemented, this is for example only, and it should be understood that these portions can also be implemented using analog techniques.

Figure 2:
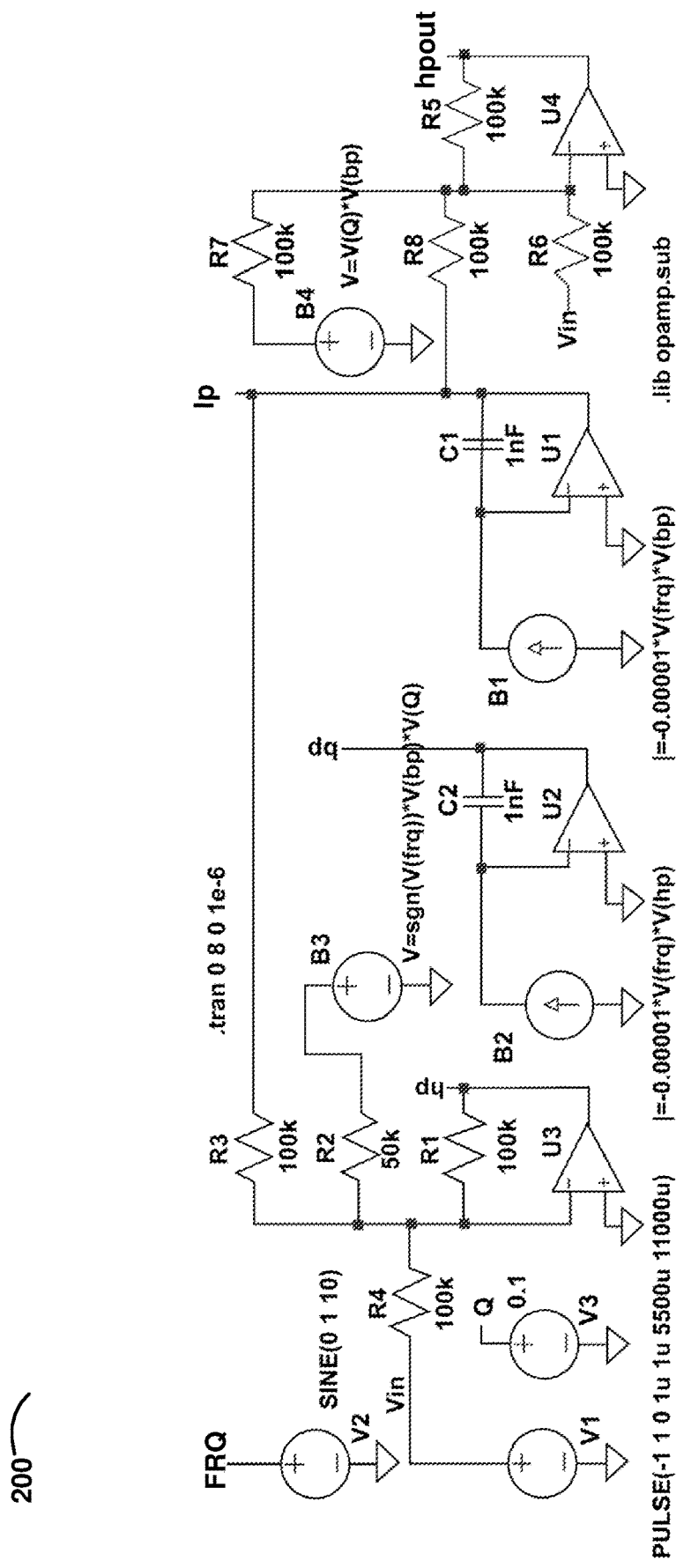
FIG. 2 illustrates an example SPICE schematic diagram for the example embodiment in FIG. 1.

FIG. 2 is an example SPICE schematic diagram 200 for the example embodiment in FIG. 1. Among other things, this example schematic diagram 200 explicitly illustrates the control of resonance (Q). The Q voltage source actually represents 2/Q; a lower voltage is a higher Q. FIG. 2 shows the equation including inverting the sign of the bandpass feedback based on the sign of the frequency variable (e.g., V=sgn(V(frq))*V(bp)*V(Q)). Although the inverting of the sign can add a non-linear element to the loop that can cause a undesirable discontinuity (glitch) when the frequency goes through zero, the example in FIG. 2 includes the generation of the separate highpass output (hpout) signal that prevents the glitch on the highpass output of the filter when the frequency changes sign.

Figure 3:
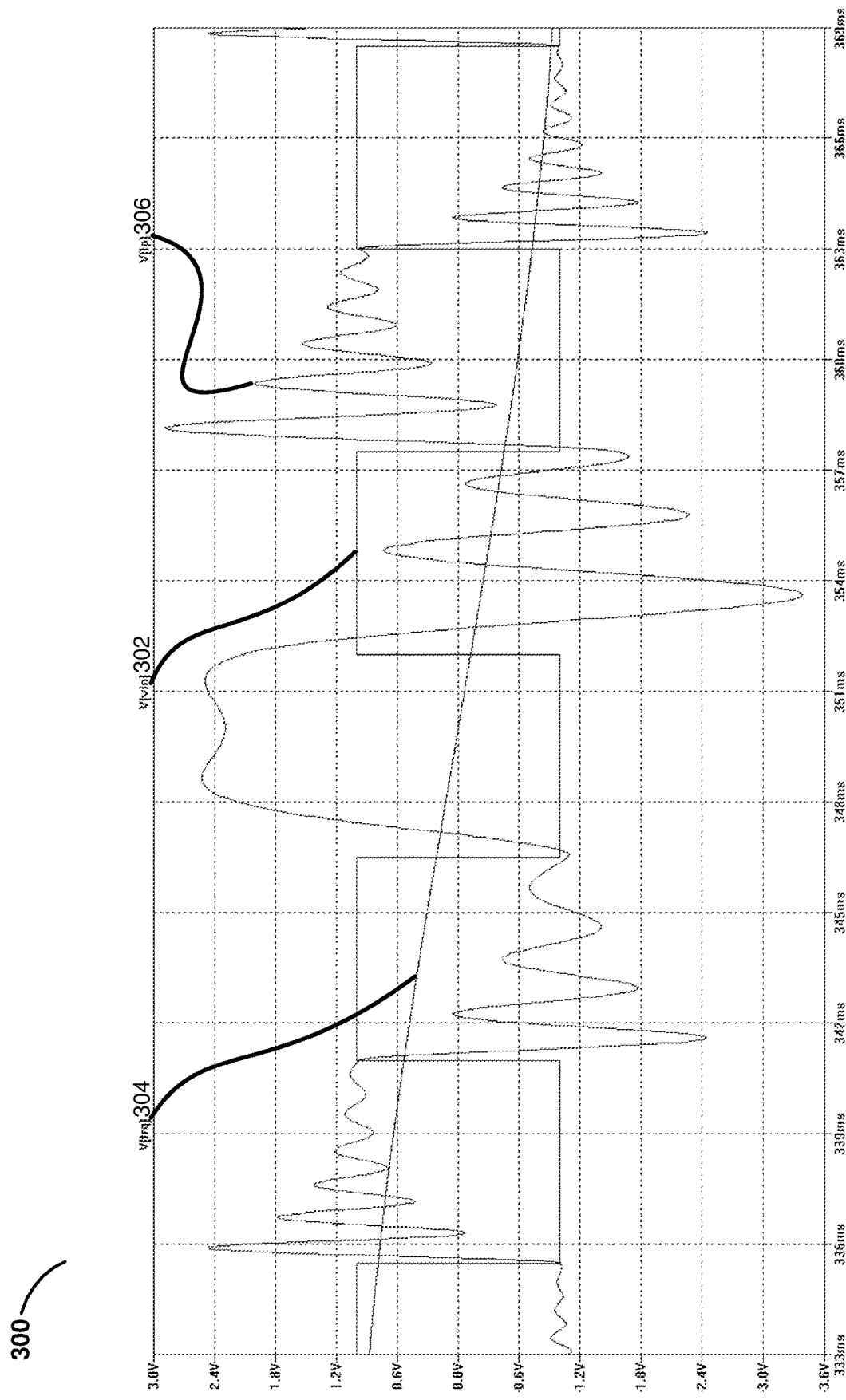
FIG. 3 illustrates example SPICE simulation results to explain certain aspects of the Lowpass Output for the example embodiment in FIG. 1.

FIG. 3 illustrates example SPICE simulation results 400 to explain certain aspects of the Lowpass Output, for the example embodiment in FIG. 1. More specifically, FIG. 3 illustrates the SPICE simulation results 300 of a square wave input 302 (blue trace in original, V(vin)) with a varying frequency 304 (green trace in original, V(frq)) going through zero, showing the phase slow-down and reversal of the resonance at the lowpass output 306 (red trace in original, V(lp)).

Figure 4:
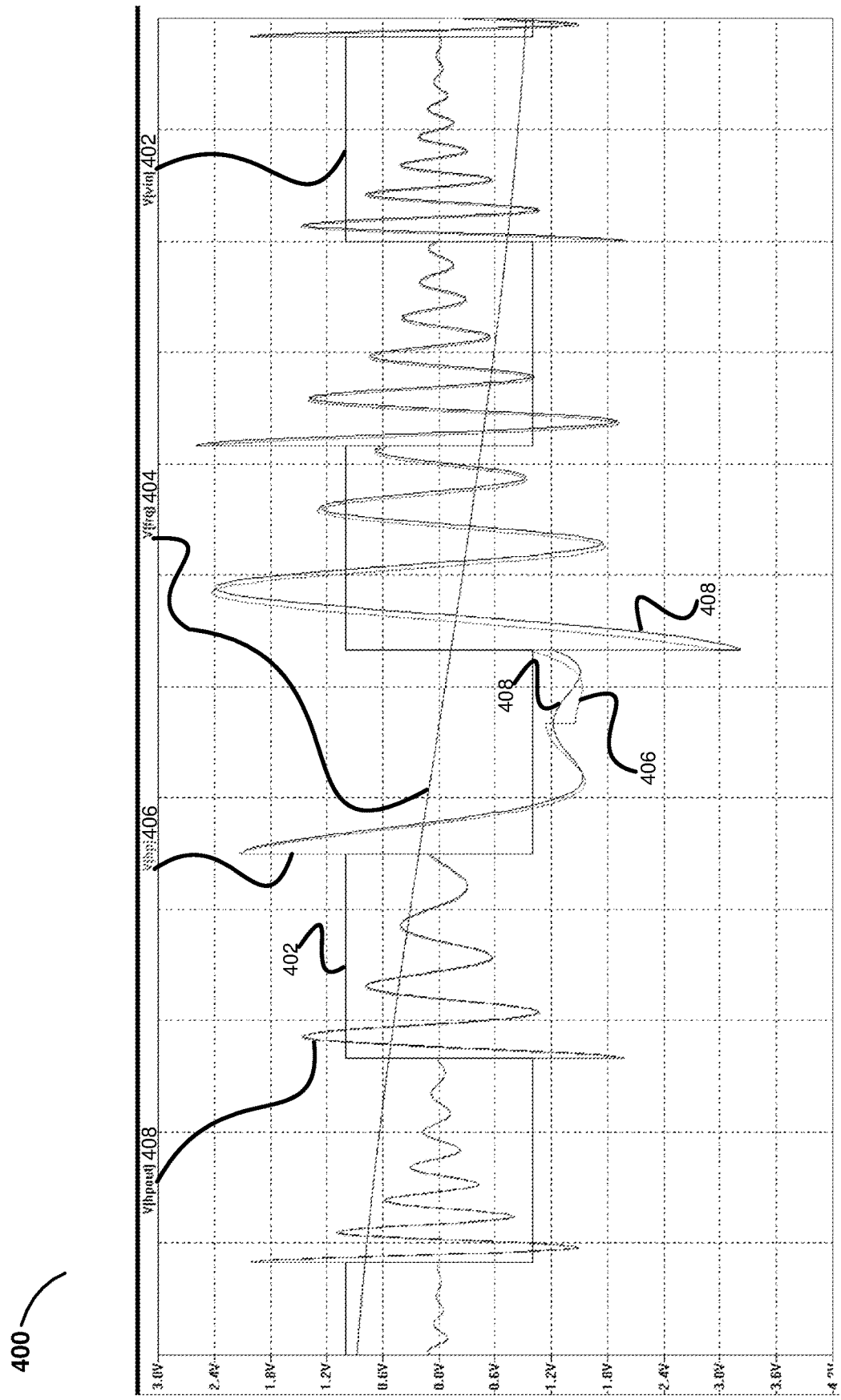
FIG. 4 illustrates example SPICE simulation results to illustrate aspects of the Highpass Output, for the example embodiment in FIG. 1.

FIG. 4 illustrates example SPICE simulation results 400 to illustrate aspects of the Highpass Output, for the example embodiment in FIG. 1. More specifically, FIG. 3 illustrates the SPICE simulation results 400 of a square wave input 402 (blue trace in original, V(vin)) with a varying frequency 404 (green trace in original, V(frq)) changing sign as it goes through zero, showing the undesirable discontinuity (glitch) identified at 406) at zero frequency on the feedback highpass signal (red trace in original, V(hp)), and its absence on the modified highpass output 408 (yellow trace in original, V(hpout)). Thus, the undesirable discontinuity, that would otherwise appear in the highpass output of the filter, has been eliminated in various embodiments.

It is noted that the above examples applicable to music synthesis all filter a monophonic note. Using techniques well-known to those skilled in the art, example embodiments described herein can be adapted for providing multiple channels of the analog implementation. Having multiple channels can create polyphonic instruments, which can play many notes at once, typically controlled by a musical keyboard. Also note that when implemented using digital techniques, polyphonic instruments can be created by multiple CPUs, multiple threads, or other time domain multiplexing techniques well-known to those skilled in the art.

Figure 5:
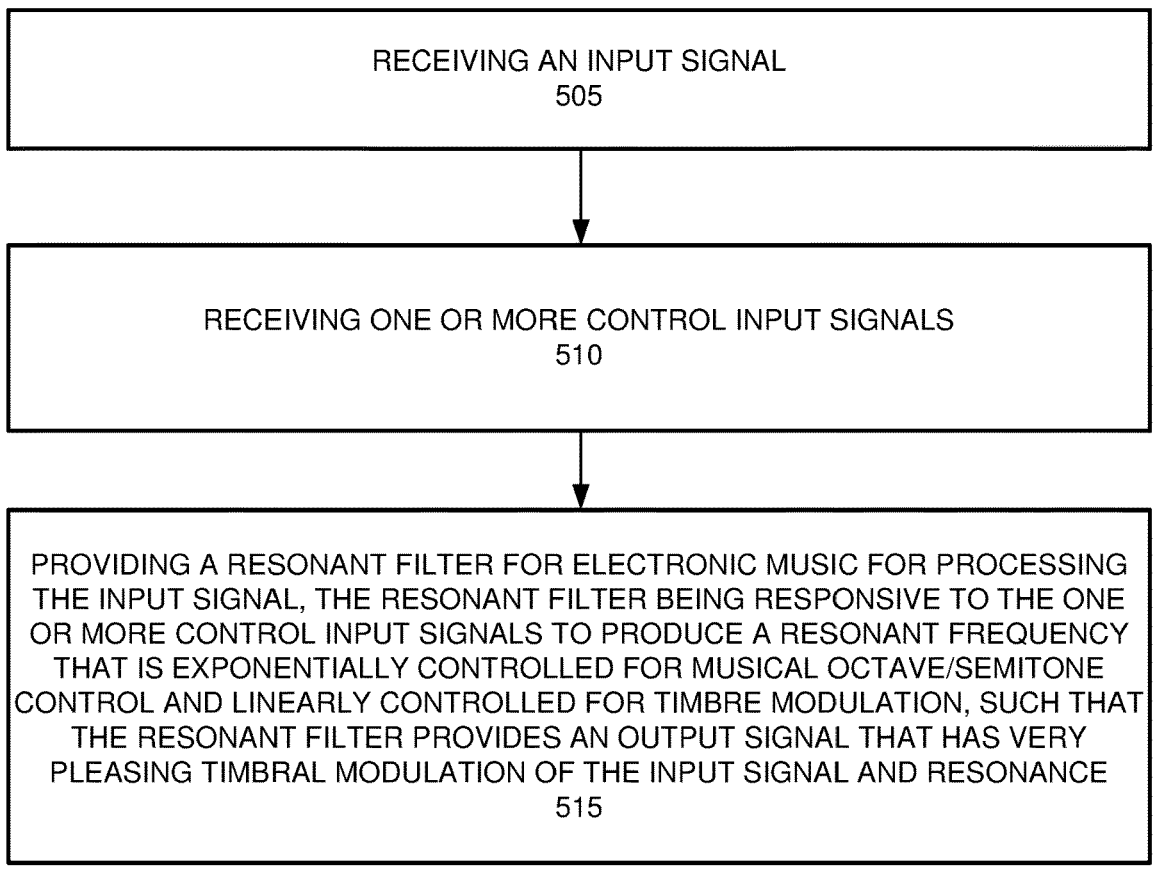
FIG. 5 is a flow diagram showing a method for providing an audio filter with through-zero linearly variable resonant frequency such that the audible result is a very pleasing timbral modulation of the input signal and any filter resonances, according to an example embodiment.

FIG. 5 is a simplified flow diagram (flow chart) of a method 500, according to an example embodiment. Operation 505 includes receiving an input signal, as described further herein.

Operation 510 includes receiving one or more control input signals, as described further herein.

Operation 515 includes providing a resonant filter for electronic music for processing the input signal, the resonant filter being responsive to the one or more control input signals to produce a resonant frequency that is exponentially controlled for musical octave/semitone control and linearly controlled for timbre modulation, such that the resonant filter provides an output signal that has very pleasing timbral modulation of the input signal and resonance, as described further herein.

Figure 6:
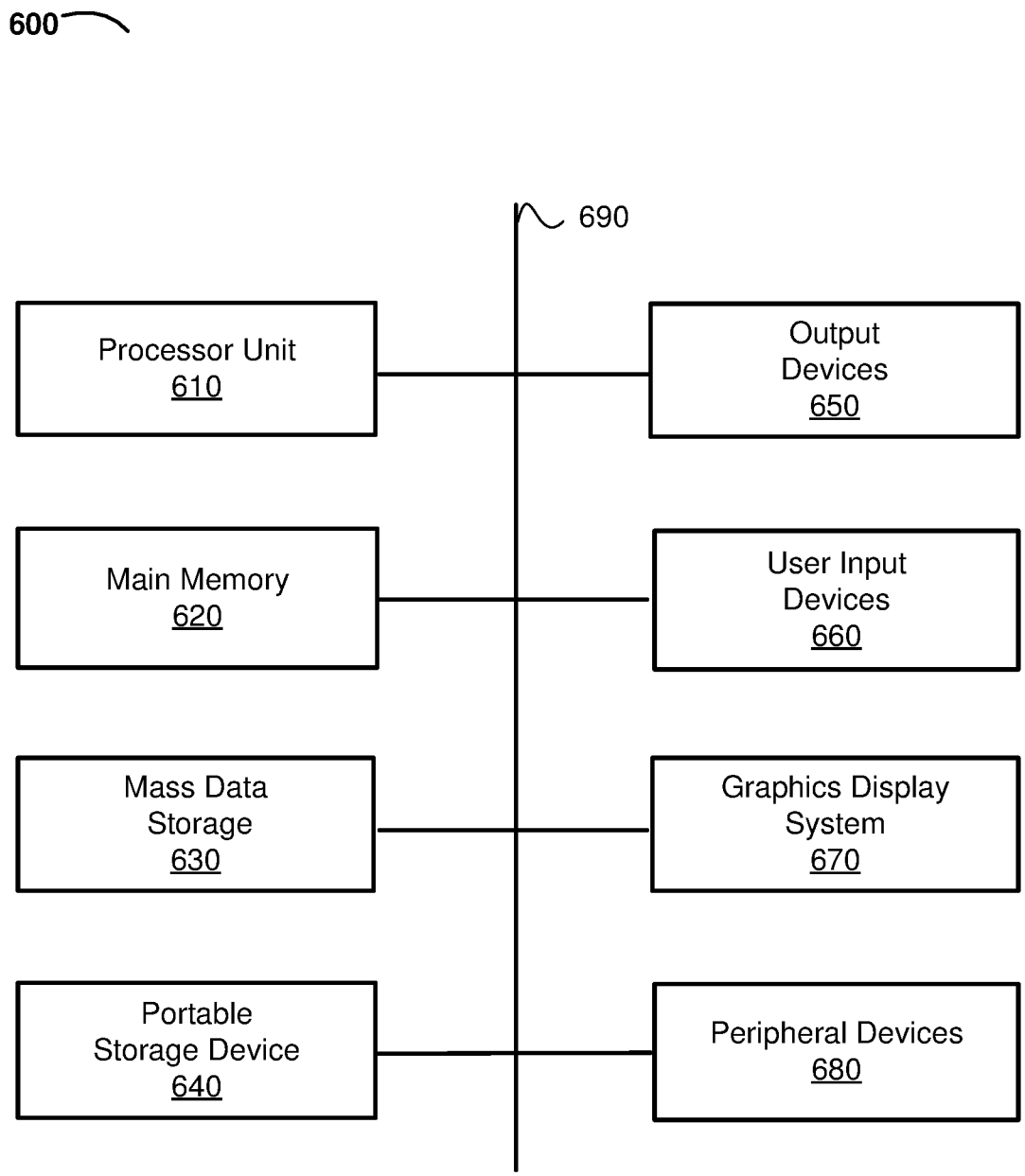
FIG. 6 is a schematic diagram of a computing system that is used to implement embodiments according to the present technology.

FIG. 6 illustrates an exemplary computer system 600 that may be used to implement various source devices according to various embodiments of the present disclosure. The computer system 600 of FIG. 6 may be implemented in the contexts of the likes of computing systems, networks, servers, or combinations thereof. The computer system 600 of FIG. 6 includes one or more processor unit(s) 610 and main memory 620. Main memory 620 stores, in part, instructions and data for execution by processor unit(s) 610. Main memory 620 stores the executable code when in operation, in this example. The computer system 600 of FIG. 6 further includes a mass data storage 630, portable storage device 640, output devices 650, user input devices 660, a graphics display system 670, and peripheral devices 680.

The components shown in FIG. 6 are depicted as being connected via a single bus 690. The components may be connected through one or more data transport means. Processor unit(s) 610 and main memory 620 are connected via a local microprocessor bus, and the mass data storage 630, peripheral devices 680, portable storage device 640, and graphics display system 670 are connected via one or more input/output (I/O) buses.

Mass data storage 630, which can be implemented with a magnetic disk drive, solid state drive, or an optical disk drive, is a non-volatile storage device for storing data and instructions for use by processor unit(s) 610. Mass data storage 630 stores the system software for implementing embodiments of the present disclosure for purposes of loading software into main memory 620.

Portable storage device 640 operates in conjunction with a portable non-volatile storage mediums (such as a flash drive, compact disk, digital video disc, or USB storage device, to name a few) to input and output data/code to and from the computer system 600 of FIG. 6. The system software for implementing embodiments of the present disclosure is stored on such a portable medium and input to the computer system 600 via the portable storage device 640.

User input devices 660 can provide a portion of a user interface. User input devices 660 may include one or more microphones; an alphanumeric keypad, such as a keyboard, for inputting alphanumeric and other information; or a pointing device, such as a mouse, a trackball, stylus, or cursor direction keys, or a musical instrument keyboard. User input devices 660 can also include a touchscreen, or other interfaces to sense musical gestures such as pedals, wheels, or touch sensors within a keyboard. Additionally, the computer system 600 as shown in FIG. 6 includes output devices 650. Suitable output devices 650 include speakers, printers, network interfaces, and monitors.

Graphics display system 670 include a liquid crystal display (LCD) or other suitable display device. Graphics display system 670 is configurable to receive textual and graphical information and process the information for output to the display device. Peripheral devices 680 may include any type of computer support device to add additional functionality to the computer, including MIDI (Musical Instrument Digital Interface) interfaces.

The components provided in the computer system 600 of FIG. 6 are those typically found in computer systems that may be suitable for use with embodiments of the present disclosure and are intended to represent a broad category of such computer components that are well known in the art. Thus, the computer system 600 of FIG. 6 can be a personal computer (PC), hand held computer system, telephone, mobile computer system, workstation, tablet, phablet, mobile phone, server, minicomputer, mainframe computer, wearable, computer controlled musical instrument, or any other computer system. The computer may also include different bus configurations, networked platforms, multi-processor platforms, and the like. Various operating systems may be used including UNIX, LINUX, WINDOWS, MAC OS, ANDROID, IOS, CHROME, TIZEN and other suitable operating systems.

Some of the above-described functions may be composed of instructions that are stored on storage media (e.g., computer-readable medium). The instructions may be retrieved and executed by the processor. Some examples of storage media are memory devices, tapes, disks, and the like. The instructions are operational when executed by the processor to direct the processor to operate in accord with the technology. Those skilled in the art are familiar with instructions, processor(s), and storage media.

The processing for various embodiments may be implemented in software that is cloud-based. The computer system 600 may be implemented as a cloud-based computing environment. In other embodiments, the computer system 600 may itself include a cloud-based computing environment. Thus, the computer system 600, when configured as a computing cloud, may include pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices.

The cloud may be formed, for example, by a network of web servers that comprise a plurality of computing devices, such as the computer system 600, with each server (or at least a plurality thereof) providing processor and/or storage resources. These servers may manage workloads provided by multiple users (e.g., cloud resource customers or other users).

It is noteworthy that any hardware platform suitable for performing the processing described herein is suitable for use with the technology. The terms "computer-readable storage medium" and "computer-readable storage media" as used herein refer to any medium or media that participate in providing instructions to a CPU for execution. Such media can take many forms, including, but not limited to, non-volatile media, volatile media and transmission media. Non-volatile media include, e.g., optical, magnetic, and solid-state disks, such as a fixed disk. Volatile media include dynamic memory, such as system random-access memory (RAM). Transmission media include coaxial cables, copper wire and fiber optics, among others, including the wires that comprise one embodiment of a bus. Transmission media can also take the form of acoustic or light waves, such as those generated during radio frequency (RF) and infrared (IR) data communications. Common forms of computer-readable media include, e.g., a floppy disk, a flexible disk, a hard disk, magnetic tape, any other magnetic medium, a CD-ROM disk, digital video disk (DVD), any other optical medium, any other physical medium with patterns of marks or holes, a RAM, a programmable read-only memory (PROM), an erasable programmable read-only memory (EPROM), an electrically erasable programmable read-only memory (EE-PROM), a Flash memory, any other memory chip or data exchange adapter, a carrier wave, or any other medium from which a computer can read.

Various forms of computer-readable media may be involved in carrying one or more sequences of one or more instructions to a CPU for execution. A bus carries the data to system RAM, from which a CPU retrieves and executes the instructions. The instructions received by system RAM can optionally be stored on a fixed disk either before or after execution by a CPU.

Computer program code for carrying out operations for aspects of the present technology may be written in any combination of one or more programming languages, including an object oriented programming language such as JAVASCRIPT, JAVA, SMALLTALK, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (e.g., through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present technology has been presented for purposes of illustration and description, but is not intended to be exhaustive or limited to the invention in the form disclosed. Many modifications and variations will be apparent to those of ordinary skill in the art without departing from the scope and spirit of the invention. Exemplary embodiments were chosen and described in order to best explain the principles of the present technology and its practical application, and to enable others of ordinary skill in the art to understand the invention for various embodiments with various modifications as are suited to the particular use contemplated.

Aspects of the present technology are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present technology. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The description of the present technology has been presented for purposes of illustration and description, but is not intended to be exhaustive or limited to the invention in the form disclosed. Many modifications and variations will be apparent to those of ordinary skill in the art without departing from the scope and spirit of the invention. Exemplary embodiments were chosen and described in order to best explain the principles of the present technology and its practical application, and to enable others of ordinary skill in the art to understand the invention for various embodiments with various modifications as are suited to the particular use contemplated.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" or "according to one embodiment" (or other phrases having similar import) at various places throughout this specification are not necessarily all referring to the same embodiment. Furthermore, the particular features, structures, or characteristics may be combined in any suitable manner in one or more embodiments. Furthermore, depending on the context of discussion herein, a singular term may include its plural forms and a plural term may include its singular form. Similarly, a hyphenated term (e.g., "on-demand") may be occasionally interchangeably used with its non-hyphenated version (e.g., "on demand"), a capitalized entry (e.g., "Software") may be interchangeably used with its non-capitalized version (e.g., "software"), a plural term may be indicated with or without an apostrophe (e.g., PE's or PEs), and an italicized term (e.g., "N+1") may be interchangeably used with its non-italicized version (e.g., "N+1"). Such occasional interchangeable uses shall not be considered inconsistent with each other.

Also, some embodiments may be described in terms of "means for" performing a task or set of tasks. It will be understood that a "means for" may be expressed herein in terms of a structure, such as a processor, a memory, an I/O device such as a camera, or combinations thereof. Alternatively, the "means for" may include an algorithm that is descriptive of a function or method step, while in yet other embodiments the "means for" is expressed in terms of a mathematical formula, prose, or as a flow chart or signal diagram.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is noted at the outset that the terms "coupled," "connected", "connecting," "electrically connected," etc., are used interchangeably herein to generally refer to the condition of being electrically/electronically connected. Similarly, a first entity is considered to be in "communication" with a second entity (or entities) when the first entity electrically sends and/or receives (whether through wireline or wireless means) information signals (whether containing data information or non-data/control information) to the second entity regardless of the type (analog or digital) of those signals. It is further noted that various figures (including component diagrams) shown and discussed herein are for illustrative purpose only, and are not drawn to scale.

While specific embodiments of, and examples for, the system are described above for illustrative purposes, various equivalent modifications are possible within the scope of the system, as those skilled in the relevant art will recognize. For example, while processes or steps are presented in a given order, alternative embodiments may perform routines having steps in a different order, and some processes or steps may be deleted, moved, added, subdivided, combined, and/or modified to provide alternative or sub-combinations. Each of these processes or steps may be implemented in a variety of different ways. Also, while processes or steps are at times shown as being performed in series, these processes or steps may instead be performed in parallel, or may be performed at different times.

While various embodiments have been described above, it should be understood that they have been presented by way of example only, and not limitation. The descriptions are not intended to limit the scope of the invention to the particular forms set forth herein. To the contrary, the present descriptions are intended to cover such alternatives, modifications, and equivalents as may be included within the spirit and scope of the invention as defined by the appended claims and otherwise appreciated by one of ordinary skill in the art. Thus, the breadth and scope of a preferred embodiment should not be limited by any of the above-described exemplary embodiments.

What is claimed is:

1. A method for providing an audio filter with through-zero linearly variable resonant frequency, the method comprising:
receiving an input signal;
receiving one or more control input signals; and
providing a resonant filter for electronic music for processing the input signal, the resonant filter being responsive to the one or more control input signals to produce a resonant frequency that varies through zero and is at least linearly controlled, such that the resonant filter provides an output signal that has timbral modulation of the input signal.

2. The method of claim 1, wherein the resonant filter is additionally exponentially controlled and has an output waveform that is invariant over corresponding exponential changes of both an input signal pitch and the resonant frequency.

3. The method of claim 1, wherein the resonant filter is additionally exponentially controlled and includes an exponential times linear multiplication to produce the resonant frequency control.

4. The method of claim 1, wherein the resonant filter includes a state variable filter.

5. The method of claim 4, comprising providing a circuit for configuring the state variable filter to be responsive to the one or more control input signals to produce the resonant frequency that is exponentially controlled for a musical octave/semitone control and linearly controlled for the timbral modulation.

6. The method of claim 1, wherein the one or more control input signals include control voltages for controlling some parameters of the resonant filter.

7. The method of claim 1, wherein the one or more control input signals include one or more linear frequency control inputs, the control inputs linearly modulating the resonant frequency of a state variable filter as a function of the one or more linear frequency control inputs.

8. The method of claim 1, comprising enabling the resonant filter resonant frequency to be exponentially voltage controlled.

9. The method of claim 4, wherein the state variable filter is a stereo state variable filter.

10. The method of claim 1, wherein the resonant filter is implemented in an analog domain.

11. The method of claim 1, wherein at least part of the resonant filter is implemented in a digital domain.

12. The method of claim 4, further comprising controlling resonance of the state variable filter, the controlling including inverting a sign of a bandpass feedback of the state variable filter based on the sign of the resonant frequency.

13. The method of claim 12, providing for the resonant filter a lowpass output, a bandpass output, and a highpass output, and providing circuitry for generating a separate highpass output signal for preventing a glitch on the highpass output of the filter when the resonant frequency changes sign.

14. The method of claim 8, wherein the resonant filter resonant frequency has a nominal value F0 when its control inputs are all zero, expressed as:

$$F=F0*(1+K*\text{linearCV})*2^{(expoCV)}$$

where linearCV is a linear control voltage in volts, expoCV is a 1V/octave exponential control voltage in volts, and K is a constant that determines a maximum attainable modulation index.

15. A resonant audio filter having through-zero linearly variable resonant frequency, the resonant audio filter comprising:
an input signal;
one or more input control voltages;
a state variable filter configured to provide at least one of lowpass, bandpass, and highpass outputs,
the state variable filter capable of having its resonant frequency linearly modulated through zero into negative frequency; and
circuitry for configuring the state variable filter such that the state variable filter is responsive to the one or more input control voltages to produce a resonant frequency that varies through zero and is at least linearly controlled, such that the resonant audio filter provides an output signal that has timbral modulation of the input signal.

16. The resonant audio filter of claim 15, wherein stability is maintained at least in part by inverting a sign of a bandpass feedback of the state variable filter based on the sign of the resonant frequency.

17. The resonant audio filter of claim 15, wherein the resonant audio filter is implemented digitally.

18. The resonant audio filter of claim 17, wherein the one or more input control voltages include one or more linear frequency control inputs, the resonant audio filter linearly modulating the resonant frequency of the state variable filter as a function of the one or more linear frequency control inputs.

19. The resonant audio filter of claim 15, wherein the circuitry enables the resonant audio filter resonant frequency to be exponentially voltage controlled.

20. The resonant audio filter of claim 15, wherein one of the one or more input control voltages is supplied by a modulation oscillator whose frequency tracks the exponentially controlled resonant frequency.

21. A digital filter module comprising:
one or more control inputs;
a processor, and a memory for storing executable instructions, the processor executing instructions to:
receive, via the digital filter module at least one input audio signal;
receive via the one or more control inputs at least one control voltage;
resonantly filtering the at least one input audio signal by at least one resonant filter;
linearly modulating a resonant frequency of the at least one resonant filter through zero frequency to enable negative frequency modulation so as to produce a timbral modulation of the input signal and any filter resonances; and performing exponential times linear multiplication to determine the resonant frequency, responsive to the at least one control voltage, that is exponential for musical octave/semitone control and linear for timbre modulation, wherein a digital filter waveform is invariant over corresponding exponential changes in pitch of both the at least one input audio signal and the exponential at least one control voltage.

\* \* \* \* \*